United States Patent
Williams et al.

(10) Patent No.: US 7,329,551 B2
(45) Date of Patent: Feb. 12, 2008

(54) MANUFACTURING AND TESTING OF ELECTROSTATIC DISCHARGE PROTECTION CIRCUITS

(75) Inventors: Richard K. Williams, Cupertino, CA (US); Michael E. Cornell, Campbell, CA (US); Wai Tien Chan, New Territories (HK)

(73) Assignees: Advanced Analogic Technologies, Inc., Santa Clara, CA (US); Advanced Analogic Technologies (Hong Kong) Limited, Kowloon (HK)

( * ) Notice: Subject to any disclaimer, the term of this patent is extended or adjusted under 35 U.S.C. 154(b) by 461 days.

(21) Appl. No.: 11/124,439

(22) Filed: May 5, 2005

(65) Prior Publication Data

US 2005/0202577 A1 Sep. 15, 2005

Related U.S. Application Data

(62) Division of application No. 10/423,177, filed on Apr. 24, 2003, now Pat. No. 6,906,386.

(60) Provisional application No. 60/435,830, filed on Dec. 20, 2002.

(51) Int. Cl.
*H01L 21/66* (2006.01)
(52) U.S. Cl. ............... 438/14; 438/17; 438/18
(58) Field of Classification Search .................. 438/10, 438/11, 14, 15, 17, 18
See application file for complete search history.

(56) References Cited

U.S. PATENT DOCUMENTS

| | | | | |
|---|---|---|---|---|
| 5,359,211 | A | * | 10/1994 | Croft ........................... 257/173 |
| 5,535,086 | A | * | 7/1996 | Mentzer ...................... 361/56 |
| 5,838,043 | A | * | 11/1998 | Yuan ........................... 257/355 |
| 5,900,643 | A | | 5/1999 | Preslar et al. |
| 6,147,857 | A | * | 11/2000 | Worley et al. ........... 361/301.2 |
| 6,172,383 | B1 | | 1/2001 | Williams |
| 6,657,835 | B2 | | 12/2003 | Ker et al. |
| 6,757,147 | B1 | * | 6/2004 | Tong et al. .................. 361/111 |
| 6,972,487 | B2 | * | 12/2005 | Kato et al. .................. 257/723 |
| 2003/0011052 | A1 | | 1/2003 | Kim |

FOREIGN PATENT DOCUMENTS

| | | |
|---|---|---|
| KR | 10-1999-0085637 | 12/1999 |
| KR | 10-2000-0077143 | 12/2000 |

* cited by examiner

*Primary Examiner*—Kevin M. Picardat
(74) *Attorney, Agent, or Firm*—David T. Millers

(57) ABSTRACT

A semiconductor die has a bonding pad for a MOSFET such as a power MOSFET and a separate bonding pad for ESD protection circuitry. Connecting the bonding pads together makes the ESD protection circuitry functional to protect the MOSFET. Before connecting the bonding pads together, the ESD protection circuitry and/or the MOSFET can be separately tested. A voltage higher than functioning ESD protection circuitry would permit can be used when testing the MOSFET. A packaging process such as wire bonding or attaching the die to a substrate in a flip-chip package can connect the bonding pads after testing.

15 Claims, 13 Drawing Sheets

MANUFACTURING AND TESTING OF ELECTROSTATIC DISCHARGE PROTECTION CIRCUITS

CROSS-REFERENCE TO RELATED PATENT APPLICATIONS

This patent document is a divisional of and claims the benefit of the earlier priority date of U.S. patent application Ser. No. 10/423,177, filed Apr. 24, 2003, now U.S. Pat. No. 6,906,386, which claims the priority date of U.S. provisional patent application No. 60/435,830, filed Dec. 20, 2002, both of which are hereby incorporated by reference in their entirety.

BACKGROUND

Semiconductor devices such as power MOSFETs often contain electrostatic discharge (ESD) protection circuits that protect the devices from damage that ESD can cause. FIG. 1A shows a circuit diagram for a semiconductor device 100 having ESD protection. Device 100 includes a MOS (metal-oxide-semiconductor) field effect transistor (MOSFET) 107. A bonding pad 101 (sometimes referred to herein as a gate pad), a bonding pad 102 (sometimes referred to herein as a source pad), and a bonding pad 103 (sometimes referred to herein as a drain pad) are respectively connected to the gate, source, and drain of MOSFET 107. In some cases (as in a vertical power MOSFET), the drain pad 105 is actually the backside of the wafer whereby the "pad" indicates an external connection, but not necessarily a bonding pad, perse. A PN junction diode 108 naturally present between drain pad 103 and source pad 102 in MOSFET 107 protects against high drain-to-source voltage that could damage junctions in MOSFET 107. For ESD protection of the gate insulator in MOSFET 107, device 100 has back-to-back zener diodes 104 and 105 connected in series between gate pad 101 and source pad 102, and series gate resistor 106 representing series resistance R1 between gate pad 101 and the gate electrode contained within MOSFET 107. Unlike the protection needed between gate and source pads, no ESD diode is needed between drain pad 103 and gate pad 101 because of MOS capacitor effects that cause depletion in the silicon and low electric field across the gate oxide, even at high applied voltages.

FIG. 1B shows an ideal plot of the current $I_G$ through gate pad 101 as a function of the voltage $V_{GS}$ between gate pad 101 and source pad 102. In the normal operating range of voltage $V_{GS}$, current $I_G$ is ideally zero since a gate oxide layer insulates the gate of MOSFET 107 (preventing DC current flow from the gate) and since one of the two diodes of back-to-back pair 104 (D1) and 105 (D2) remain reverse-biased below their avalanche breakdown voltage (hence no diode current except for junction leakage should flow). Diode 104 breaks down when voltage $V_{GS}$ reaches the positive breakdown voltage $BV_{D1}$ and prevents the voltage across the gate oxide in MOSFET 107 from reaching a large positive voltage that could damage the gate oxide. Similarly, diode 105 breaks down when gate-to-source voltage $V_{GS}$ reaches the negative breakdown voltage $-BV_{D2}$ and prevents the voltage across the gate oxide from reaching a large negative value that could damage the gate oxide.

An actual device generally cannot achieve the ideal current-voltage plot of FIG. 1B because of current leakage through the gate oxide of MOSFET 107 and through diodes 104 and 105. A resistive element 106 having a resistance R1 improves the ESD protection of the gate oxide by limiting the maximum gate voltage during an ESD transient. The reduction in maximum gate voltage is achieved by slowing down the gate's voltage rise through an increase in the RC time constant of the gate-capacitance/gate-resistor network.

FIG. 1C is a cross-sectional view of an example of a semiconductor structure 120 using a vertical planar DMOS transistor for one implementation of device 100 of FIG. 1A. Semiconductor structure 120 is fabricated in and on an N++ substrate 123 having an N-type epitaxial layer 122. The vertical planar DMOS comprises a vertical current flow device with a topside source and gate connection and a backside drain connection (hence the nomenclature "vertical"). The drain pad or contact is at the bottom of N++ substrate 123. The planar DMOS is referred to as planar since the MOS action of the gate electrode occurs on the top, i.e. planar, surface of epitaxial layer 122 atop P-type body PB 121A, 121B, and 121C.

For ESD protection, back-to-back zener diodes D1 and D2 between the source and gate pads are formed using an N-type region 131, a P-type region 132, and an N-type region 133 that are adjacent portions of a polysilicon layer overlying a field oxide region 134. Through openings in a patterned insulating layer 128, a patterned metal region 129 connects the source pad (not shown) to N-type region 131 and to N+ source regions 124A, 124B, and 124C and P+ body contact regions 125A and 125B. P+ body contact regions 125A and 125B are in respective deep P-wells 127A and 127B, and the junctions between deep P-wells 127A and 127B and epitaxial layer 122 form a diode (e.g., diode 108) between the drain and source contacts.

The gate pad electrically connects to polysilicon gate regions 126A and 126B in a portion of semiconductor structure 120 not shown in FIG. 1C. Gates 126A and 126B overlie horizontal channel regions 121A, 121B, and 121C that are in P-type body regions 121A, 121B, and 121C and adjacent to respective source regions 124A, 124B, and 124C. Gates 126A and 126B also overlie portions of N-type epitaxial layer 122 that form respective drain regions. The gate pad through a metal region 130 also electrically connects to N-type polysilicon region 133, that with adjacent P-type polysilicon region 132 and N-type polysilicon region 131 forms the back-to-back zener diodes D1 and D2.

FIG. 1D is a cross-sectional view of an example of a semiconductor structure 140 using vertical transistor cells for another implementation of device 100 of FIG. 1A. As in semiconductor structure 120, semiconductor structure 140 is fabricated in and on an N++ substrate 146 having an N-type epitaxial layer 145, and the drain pad is at the bottom of N++ substrate 146.

In structure 140, an N-type region 148, a P-type region 149, and an N-type region 149, which are formed in a polysilicon layer overlying insulating layers 150 and 151, form the back-to-back zener diodes D1 and D2 for ESD protection. The source pad is connected to a patterned metal region 153 that contacts N-type region 148, N+ source regions 142A, 142B, and 142C, and P+ body contact region 143. The contacts between metal region 153 and regions 142A, 142B, 142C, and 143 can be formed in a traditional manner through openings formed during a masked etching of an insulating layer or alternatively formed using a super self aligned process such as described in U.S. Pat. No. 6,413,822, which is hereby incorporated by reference in its entirety. P+ body contact region 143 is in a P-type body 141 that also includes vertical channel regions 141A, 141B, and 141C. A junction between P-type body 141 and epitaxial layer 145 forms the diode between the drain and source pads.

The gate pad electrically connects to polysilicon gate regions 143A to 143D that are in trenches that extend through P-type body 141 into epitaxial layer 145. Oxide 144 in the trenches isolates gate regions 143A to 143D from channel regions 141A, 141B, and 141C at the vertical walls of the trenches. The gate pad via a metal region 154 also electrically connects to N-type polysilicon region 150 that with P-type polysilicon region 149 and N-type polysilicon region 148 forms back-to-back zener diodes D1 and D2 between the gate and source pads.

FIG. 1E shows a circuit diagram for another known device 200 having ESD protection circuitry. Device 200 is similar to device 100 of FIG. 1A but differs from device 100 in the addition of a second pair of back-to-back zener diodes 206 and 207. In device 200, resistive element 106 is between gate pad 101 and diode 206 and between diode 104 and diode 206. Accordingly, during an ESD event, more of the current flowing into gate pad 101 flows through diodes 104 and 105 than through diodes 206 and 207. The ESD current and voltage spike is thus kept further from the gate of MOSFET 107, with resistor 106 (R1) aiding in the division of current during an ESD transient. Device 200 can be implemented using structures similar to those of FIG. 1C or 1D.

FIGS. 2A and 2B show typical plots of the current $I_G$ through the gate pad of a power MOSFET with ESD protecting diode, where the y-axis for current $I_G$ of the graph is logarithmic in FIG. 2A and linear in FIG. 2B. FIG. 2A shows a plot 220 illustrating the room temperature leakage current for voltage $V_{GS}$ between the breakdown voltages BV1 and −BV2 of the back-to-back diodes. Shown on a log scale, the leakage current in the polysilicon diode increases rapidly at small biases, then at larger voltages the leakage saturates until breakdown is reached, whereupon a dramatic increase in current is manifest. The leakage of the gate dielectric itself is orders of magnitude less than leakage through the polysilicon diodes, so leakage through the gate dielectric has no influence on the device's gate terminal I-V characteristics. FIG. 2B shows a linear-scale plot 230 of current $I_G$ versus voltage $V_{GS}$ when the power transistor operates at a lower temperature (e.g., room temperature) and a plot 231 of current $I_G$ verses voltage $V_{GS}$ when the power transistor operates at a higher temperature. As shown in FIG. 2B, a temperature increase generally increases the leakage current and can change breakdown voltages of one or more of the diodes in the ESD protection circuitry.

Under certain conditions, the gate-to-source voltage $V_{GS}$ used in operating a power MOSFET is also known to affect the useful life of the power MOSFET. FIG. 2C shows curves 240 and 241 illustrating the useful lifetimes t3 and t4 of good power MOSFETs respectively operated at gate voltages VG1 and VG2. Of course, operating lifetime is a matter of population statistics requiring many units to discern a difference in lifetime failures (also known as end-of-life or old-age failures). In this statistical context, a good power MOSFET may have a shorter life t3 at the higher gate voltage VG2, than the power MOSFET would if biased at a lower gate bias but the lifetime t3 is still commercially valuable (e.g., more than 20 years). The specific failure mechanism is due to the acceleration of charges damaging or dislocating atoms in the oxide matrix. Failure rates increase in relation to increased electric fields across the gate dielectric (i.e., VG/Xox, where Xox is the gate oxide thickness). Plots 242 and 243 show that operating defective power MOSFETs at gate voltages VG1 and VG2 provides lifetimes t1 and t2 that are only days or weeks long, which is commercially unacceptable. Moreover it can be seen that for the same degree of defectivity, the devices operating at higher gate biases (and higher corresponding electric fields) fail first. In general, silicon dioxide formed in a defect free manner exhibits a useful life of more than 20 years as long as it is operated at maximum electric fields less than or equal to about 4 MV/cm. Defective material however may fail in one quarter their normal use life even at low bias conditions.

An ESD event can also shorten the life of a power MOSFET by creating or exacerbating damage in a dielectric, particularly if the power MOSFET has a latent gate oxide defect or weak spot. As illustrated in FIG. 2D, if an ESD event can be avoided, a power MOSFET with a latent defect can be expected to have a lifetime t3 of weeks, months and even a few years, while a good power MOSFET has a useful life that may be more than 20 years. If an ESD event occurs, a good power MOSFET that is adequately protected from ESD may have its life shortened somewhat, but the good power MOSFET will still generally have a useful lifetime t4 that is more than 15 to 20 years. Adequate protection in this context generally means that the maximum voltage electric field strength in the gate insulator does not exceed 8 Mv/cm or if the voltage electric field does exceed this value, the pulse duration is held to a very short duration by the ESD protection elements. Short (sub-nanosecond) duration pulses do minimal damage to the oxide since a short pulse contains only a limited amount of energy. If an ESD occurs and the ESD protection circuit is defective or inadequate, a power MOSFET having a latent gate oxide defect may fail almost immediately at time t0 after the ESD, although the defective power MOSFET could last for weeks or months of operation before failing catastrophically. If the ESD protection fails or is inadequate, even a good power MOSFET may prematurely fail in a short time t1 (e.g., immediately or days-to-months) later.

FIG. 2E is a histogram illustrating the premature failure rate for power MOSFETs at different electric field strengths in the gate oxides of the power MOSFETs. As illustrated, the defective power MOSFETs prematurely fail at low gate-to-source electric fields $V_{GS}$ (e.g., 3 MV/cm), while good power MOSFETs prematurely fail only at much higher voltages $V_{GS}$ (e.g., around 8 to 10 MV/cm).

Ideally, a test process for a power MOSFET would identify all power MOSFETs having latent gate oxide defects and remove them so that all defective power MOSFET can be removed from the population. As shown in plot 251 of FIG. 3, a stress test applying a gate voltage corresponding to an electric field of 4 MV/cm, just above the voltage and field (e.g., 3 MV/cm) that causes premature failure in defective power MOSFETs will cause the defective power MOSFETs to fail but may take a time t1 measured in days or weeks to separate all or most defective MOSFETs from the good MOSFETs. Test times of this length are expensive and generally not commercially practical. Plot 250 shows that a higher test voltage (e.g., 6 MV/cm) can cause a rapid failure of the defective MOSFETs and provide shorter test times allowing bad parts to be screened and pruned from the population. Unfortunately, adequate ESD protection circuits, which are necessary to prevent ESD-induced failures of good devices, may not allow testing at high enough gate voltages to identify defective devices in a reasonable amount of time. In essence, the ESD protection devices and networks included to protect in a power MOSFET actually prevents the testing of devices to remove defective components from the population.

Circuits and fabrication processes are thus needed that provide ESD protection that can be tested for operability and not interfere with the normal operation of the device. Further, the ESD protection must be adequate to prevent premature failure of good devices while still permitting stress tests that detect defective devices within a commercially efficient testing time.

SUMMARY

In accordance with an aspect of the invention, a fabrication process for an integrated circuit or semiconductor device such as a power MOSFET forms a die containing an ESD protection circuit that is separate from the device to be protected. The device and the ESD protection circuit have separate pads or connections that permit testing of the device in a manner that would be difficult or impossible if the ESD protection circuit were connected to the device before testing. After testing, a packaging process or operation can electrically connect the ESD protection circuit as required to protect the device. In this manner, the ESD protection circuit or structures need not be subjected to the stresses used to test and screen defective MOSFETs.

One specific embodiment of the invention is a manufacturing process for a semiconductor device. The process begins with fabricating a semiconductor die including ESD protection circuitry and a device such as a power MOSFET. The device has a first bonding pad, and the ESD protection circuitry has a second bonding pad for external connections. Since the bonding pads are separate, a test system electrically connected to the first bonding pad can test the device without interference from the ESD protection circuitry. The ESD protection circuitry can also be separately tested. After testing, the process connects the first bonding pad to the second bonding pad, and the ESD protection circuitry then becomes functional to protect the device against electrostatic discharge.

When the device is a power MOSFET, testing can raise a gate pad, which is connected to the gate of the power MOSFET, to a voltage that is higher than the ESD protection circuitry permits when functional. The gate pad may or may not be a bonding pad that will be connected to a bonding pad of the ESD protection circuitry. The first bonding pad can be the gate pad or a source pad that is connected to a source of the power MOSFET depending on the ESD protection circuitry.

The testing can be performed while the die is part of a wafer containing multiple dice, while connection of the first bonding pad to the second bonding pad is usually performed after the die is separated from the wafer. In particular, connecting the first bonding pad to the second bonding pad can be during packaging of the die.

A variety of methods for connecting the bonding pads are available. For one method, connecting the first bonding pad to the second bonding pad includes forming a single wire bond that contacts the first bonding pad and the second bonding pad. Another method connects a first wire to the first bonding pad and to a portion of a lead frame and connects a second wire to the second bonding pad and to the same portion of the lead frame. The lead frame may include an external lead that provides an electrical connection to the first and second bonding pads within a package containing the die.

Another method of connecting the bonding pads includes forming a first conductive bump on the first bonding pad, forming a second conductive bump on the second bonding pad; and connecting the first and second conductive bumps to a conductive region. The conductive region may be part of a substrate brought into contact with a face of the die during a flip-chip packaging process, or even a conductive trace on a printed circuit board.

Another embodiment of the invention is a semiconductor device including a transistor such as a power MOSFET with ESD protection circuitry. A first bonding pad provides an electrical connection to the transistor. The ESD protection circuitry has a second bonding pad and only becomes functional to protect the transistor against electrostatic discharge after the first bonding pad is connected to the second bonding pad.

Many types of ESD protection circuitry can be used. However, the ESD protection circuitry typically includes a first diode having an anode connected to the second bonding pad and a second diode having a cathode connected to the cathode of the first diode. The anode of the second diode is generally connected to the gate or the source of the transistor. When the anode of the second diode is connected to the gate of the transistor, the first bonding pad is typically connected within the die to the source of the transistor. When the anode of the second diode is connected to the source of the transistor, the first bonding pad is typically connected within the die to the gate of the transistor.

Different bonding pad structures can be employed with a variety of different connecting structures. For example, one bonding pad structure exposes portions of the first and second bonding pads through a contiguous opening in an insulating layer. A wire bond in the opening extends across a gap between the first and second bonding pads to electrically connect the first bonding pad to the second bonding pad. A wire extending from the wire bond to a portion of the lead frame can provide an external connection. Alternatively, an insulating layer has separate openings to the first and second bonding pads, and separate wires can bond the two bonding pads to the same conductive portion of a lead frame.

Another bonding pad structure includes a first conductive bump on the first bonding pad and a second conductive bump on the second bonding pad. A conductive region such as part of a substrate in a flip-chip package attaches to and electrically connects the first and second conductive bumps.

Another bonding pad structure and circuit includes a power MOSFET and an ESD protection device network connected to a common bonding pad and having a connection of the ESD protection device network to a second pad, where the power MOSFET includes a source pad that becomes connected to a second pad only after testing of the device and ESD protection network.

Another bonding pad structure includes two ESD protection circuits, both of which are monolithically integrated into a power MOSFET die and electrically connected between the gate and source of the power MOSFET only after testing of both power MOSFET and diodes has been completed.

Another aspect of this invention is to permanently destroy power MOSFETs with weak gate oxides by subjecting their gate oxides to short duration high electric fields greater than 4 MV/cm, but less than 8 MV/cm. The strong electric fields render weak parts useless, so that a screening process can remove such parts from the population of manufactured products. Any ESD networks or devices are not subjected to the high voltages present during the oxide quality screening and testing, but instead the ESD protection network is connected across the gate oxide terminals only after screening has been completed.

BRIEF DESCRIPTION OF THE DRAWINGS

Use of the same reference symbols in different figures indicates similar or identical items.

DETAILED DESCRIPTION

The manufacture of semiconductor products consistent with principles of design for testability can greatly benefit the production of power MOSFETs or other discrete devices incorporating ESD protecting diodes. Specifically, manufacturing processes can better identify defects in a device such as a power MOSFET and remove the defective parts from the population if the device and its associated ESD protection circuit can be separately tested. In accordance with an aspect of the invention, wafer processing forms a semiconductor structure having separate bonding pads for the device and ESD protection circuitry. At the wafer level or at the chip level, test equipment can contact the bonding pads for the ESD protection circuitry and test the ESD protection circuitry separately from the device. Similarly, test equipment can contact the bonding pads for the device and separately test the device. The ESD protection circuitry does not inhibit testing of the device. Tests of the device can thus use higher voltages than might otherwise be possible if the device and the ESD protection circuitry shared bonding pads. The tests can thus quickly identify defects in the device or in the ESD protection circuit and as needed remove (or prevent the further use of) defective parts from the total population of manufactured products or prevent further use of the defective parts. After testing, a packaging process can electrically connect the ESD protection circuit to provide the necessary ESD protection of the device. The disclosed manufacturing method and principle is particularly of benefit if the electrical connection of the ESD diode to the device disturbs testing of the device by either limiting the maximum voltage applied during testing; or by adding to much leakage associated with the ESD device to make the device test meaningful. This condition commonly occurs when ESD diodes are formed in layers of polysilicon, material known for producing leaky PN junctions.

Figure 4:
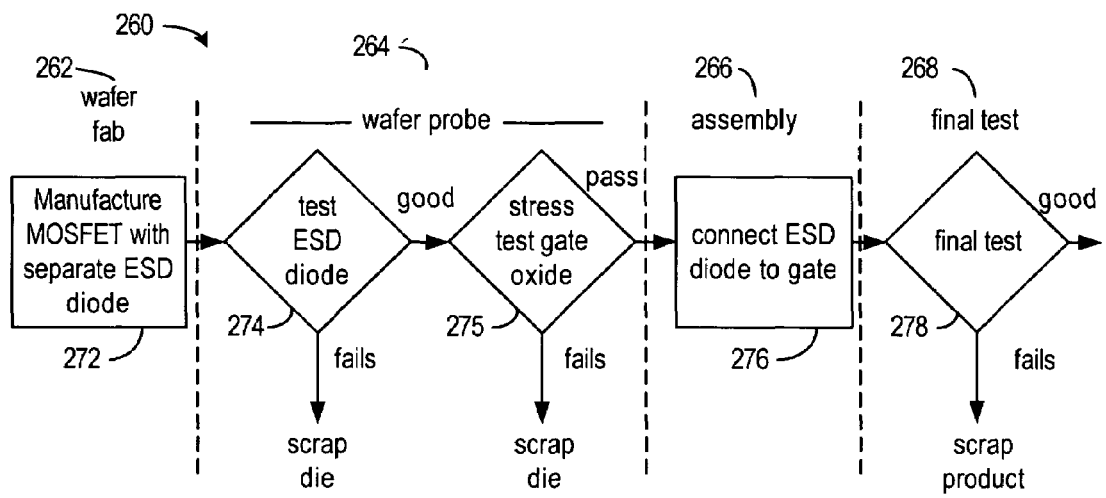
FIG. 4 is a flow diagram of a fabrication and testing process in accordance with an embodiment of the invention.

FIG. 4 is a flow diagram of a fabrication and testing process 260 for a power MOSFET (or semiconductor device) in accordance with an embodiment of the invention. Process 260 includes wafer fabrication 262, wafer probing or testing 264, die separation and assembly or packaging 266, and final testing 268 of the product.

Wafer fabrication 262 can use any desired techniques including those well-known in the art to fabricate a wafer containing multiple dice. As illustrated in step 272 of wafer fabrication process 262, wafer fabrication forms at least one bonding pad for ESD protection circuitry on each die, and the bonding pad for the ESD protection circuitry is separate from the bonding pads for the gate, drain, or source contacts of a power MOSFET. (To simplify terminology herein, a bonding pad for ESD protection circuitry is sometimes referred to as a "diode pad" since current ESD protection circuits typically contain diodes).

It should be noted that the term bonding pad is used in this description in the broadest sense as any electrical connection made to a semiconductor device from off the chip, whether employing wire bonds, solder bumps, conductive epoxy, micro-machined springs, or any other means to facilitate electrical connection to the metal conductive layers within a semiconductor component or chip. The on-chip electrical connections (whether using one or several of the aforementioned techniques in any combination) connects to conductors off the semiconductor chip, which may be a package lead frame, a printed circuit board conductive trace, conductive traces within a module or hybrid IC, or conductors within multiple chip package, so long as the off-chip connection is an electrical conductor.

The ESD protection circuitry and the power MOSFET in each die can be of conventional construction except that a diode pad is on the die where at least one of the connections required for operation of the ESD protection circuit is not within the wafer. Examples of particular placement of diode pads are described below to illustrate examples of circuit configurations in accordance with the invention.

During wafer probe process 264, a test 274 using electrical signals through the diode pad tests the operation of the ESD protection circuitry. If the ESD protection circuitry fails to perform as required, the die will be scrapped (thereby avoiding the risk of premature failure of the die if the sub-standard die encounters an ESD event during use).

If the ESD protection circuit passes test 274, a test 275 tests the power MOSFET. Test 275 can perform a stress test on the gate oxide and use a gate voltage that a properly functioning ESD protection circuit would not permit. The higher stress test voltage causes power MOSFETs having latent gate oxide defects to fail more quickly. The high gate stress causes the defective oxide to rupture leading to a gate short. The post-stressed shorted MOSFET gate oxide then will fail to pass the gate leakage test. An unstressed gate, in contrast would likely pass the gate leakage test, despite including latent defects.

Test 275 can thus detect and remove defective power MOSFETs in a short time, consistent with high production throughput and low manufacturing costs. Moreover, defective or weak components using this method will not survive the testing and assembly procedure and therefore do not pose a reliability risk to the customers and users of such products. Furthermore, since the ESD protection and the power MOSFET (or semiconductor device) tests precede assembly, bad parts are never assembled. Removing defective and weak components prior to assembly avoids added costs of parts that may have failed during the assembly and final test operations, further reducing overall manufacturing costs.

The stress conditions used to remove defectives depend on the defect being tested. For a power MOSFET, the largest failure mode is gate oxide quality failures, especially for devices having gates oxides formed in and along the sidewalls of etched trenches. The quality of such oxide depends not only on the oxidation conditions, but also on cleaning, and trench-etch conditions. Oxide-related defects not only represent the largest component of yield loss in power MOSFET manufacture, but also the greatest ESD and latent oxide defect failure risk.

To test and screen oxide quality, gate oxides comprising defect-free silicon dioxide typically fail at 8 MV/cm for thick oxides and 10 MV/cm for thin oxides. The reason the critical electric field for avalanche breakdown in a dielectric improves for thinner layers (typically below 200A) is that the increase in tunneling current reduces the preponderance of high momentum carriers. Since dielectrics can easily survive indefinitely operating at half the critical electric field, i.e., 4 to 5 MV/cm, then a short screening operation must be greater than this electric field about half of the critical electric field but less than the avalanche critical field. Within this range, the higher the field, the shorter the test time need be to screen and reject defectives.

Theoretically, a screening test may therefore be executed at from 60% to 90% of the critical electrical field causing avalanche in the dielectric. In practice, however, 60% of maximum field may not screen all the defectives in a reasonable time. Conversely, 90% of the avalanche field may actually damage some devices that were not previously defective. Electric field strengths of 65% to 80% are therefore more practical with 70% to 75% of the critical field being recommended.

Converting field strength into a gate-to-source voltage VGS depends on oxide thickness, and is given by the equation $$V_{GS} = X_{ox} \cdot E_{aval}$$

where $V_{GS}$ is the applied gate voltage, $X_{ox}$ is the oxide thickness, and $E_{aval}$ is the critical electric field of avalanche as shown in Table I:

TABLE I

Examples of Gate Over-Stress Conditions to Remove Latent Oxide Defects

| Oxide Thickness (A) | Critical Field (MV/cm) | Avalanche $V_{GS}$ (V) | 65-80% $V_{GS}$ Stress Range (V) | 70% $V_{GS}$ Target Stress (V) |
|---|---|---|---|---|
| 1000 | 8 | 80 | 52-64 | 56 |
| 500 | 8 | 40 | 26-32 | 28 |
| 300 | 8 | 24 | 15.6-19.2 | 16.8 |
| 200 | 8 | 16 | 10.4-12.8 | 11.2 |
| 150 | 9 | 13.5 | 8.8-10.8 | 9.5 |
| 100 | 10 | 10 | 6.5-8.0 | 7.0 |

During assembly process 266, conventional techniques, such as sawing or scribing cut the wafer and separate the dies for packaging. In accordance with an aspect of the invention, assembly process 266 includes a process that connects one or more bonding pads for the ESD protection circuitry (e.g., a diode pad) to one or more of the bonding pads of the power MOSFET (e.g., a gate pad or a source pad). The connection of the diode pad or pads during packaging connects the ESD protection circuitry as required to protect the power MOSFET. In broader terms, the assembly process completes the electrical circuit whereby an ESD device or protection circuit becomes connected in parallel with the device, element or circuit requiring protection, (where the ESD protection and the element requiring protection were not in parallel prior to the assembly process).

A variety of techniques for connecting the bonding pads of the ESD protection circuitry to the bonding pads of the power MOSFET are available. Some packaging techniques and structures for bonding pad connection are described further below. The connection technique employed will generally depend on the location of the bonding pads and the desired type of package (e.g., a flip-chip package, chip-on-board, or a package with wire bonds).

After assembly or packaging 266, a final test 268 determines in a step 278 whether the packaged products are good or defective. Defective products are scrapped. Because more extreme stress conditions used to detect and remove defectives occurred earlier, the final test is performed using normal bias conditions typical to the operating specifications of the product.

Figure 1A:
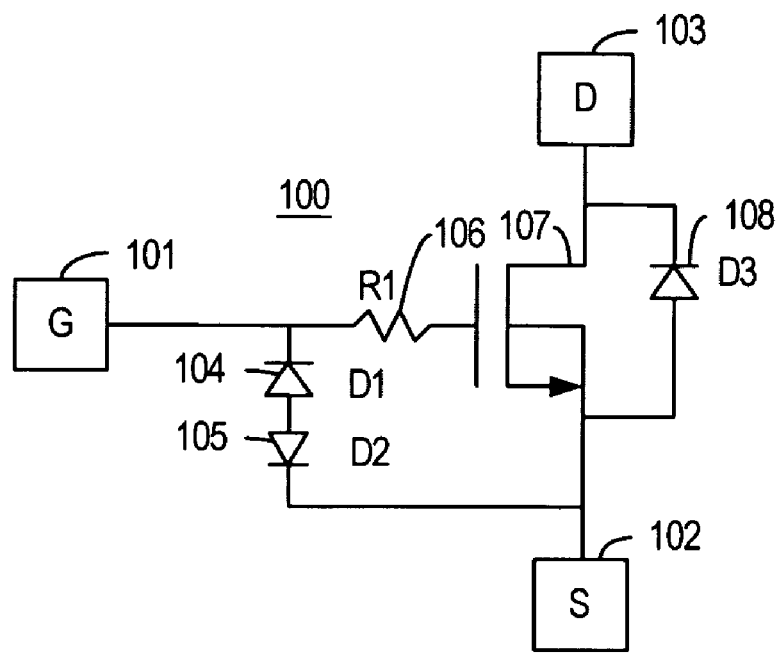
FIG. 1A is a circuit diagram of a power MOSFET with a known ESD protection circuit.
Figure 1B:
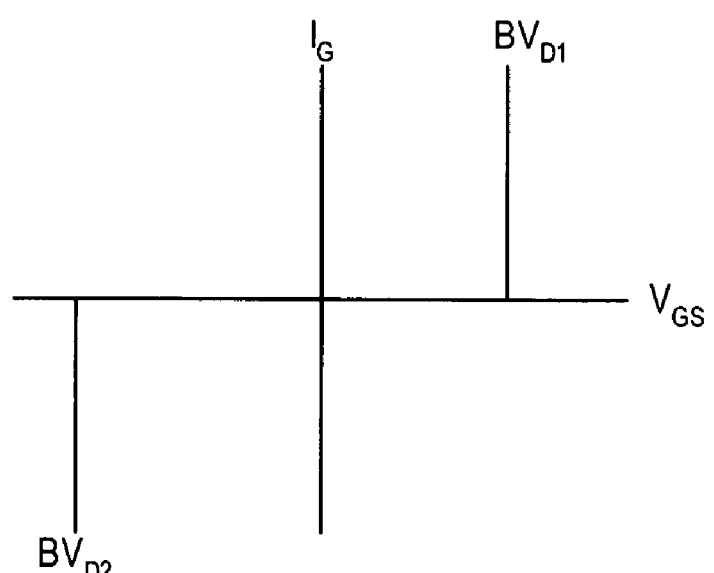
FIG. 1B shows an ideal plot of the gate current (through the gate pad) versus gate-to-source voltage of the MOSFET of FIG. 1A.
Figure 1C:
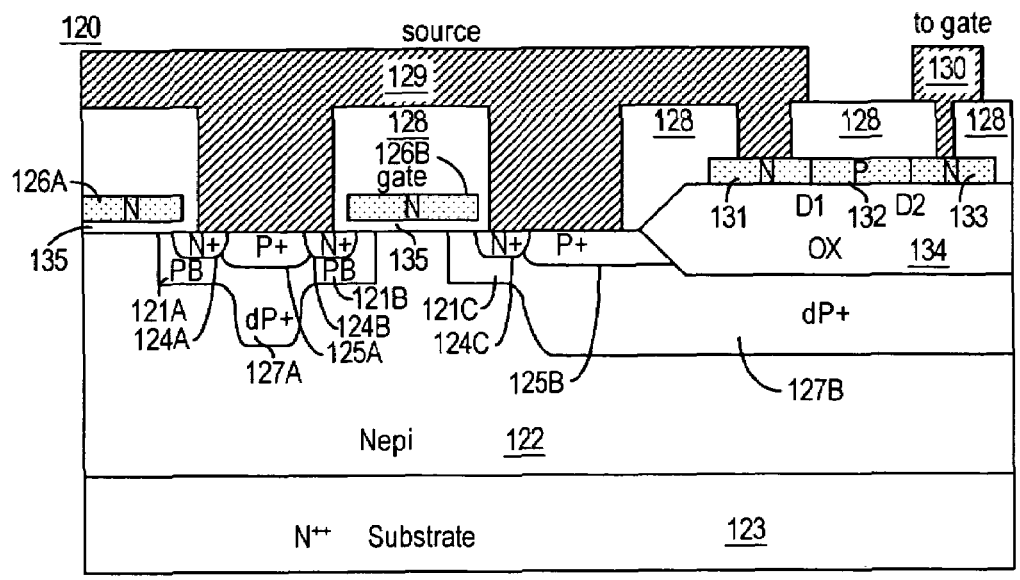
FIGS. 1C and 1D are cross-sectional views of known semiconductor structures for planar and trench-gate power MOSFETs, respectively, both represented by the circuit diagram of FIG. 1A.
Figure 1D:
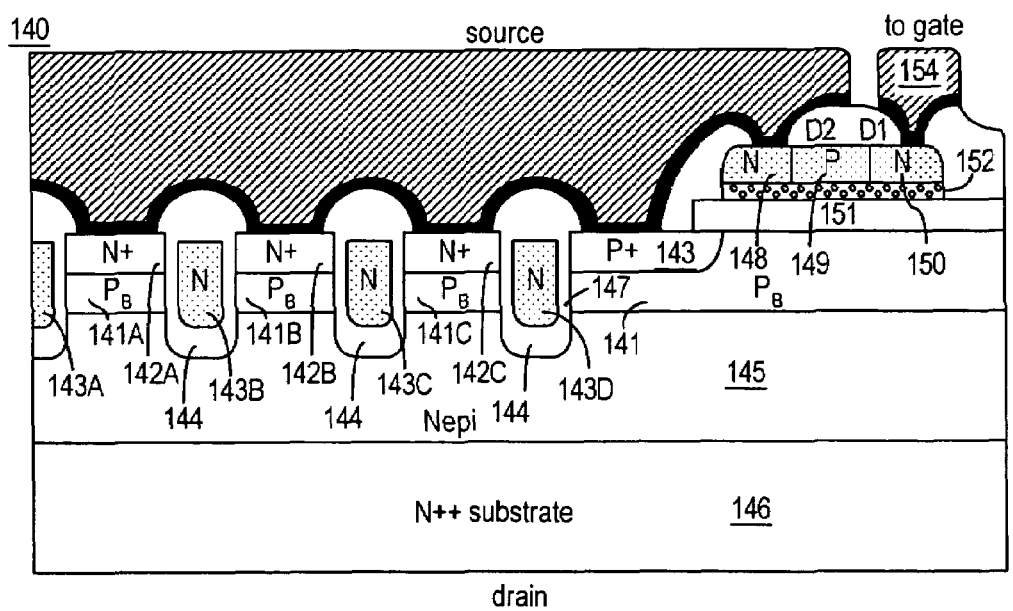
Figure 5A:
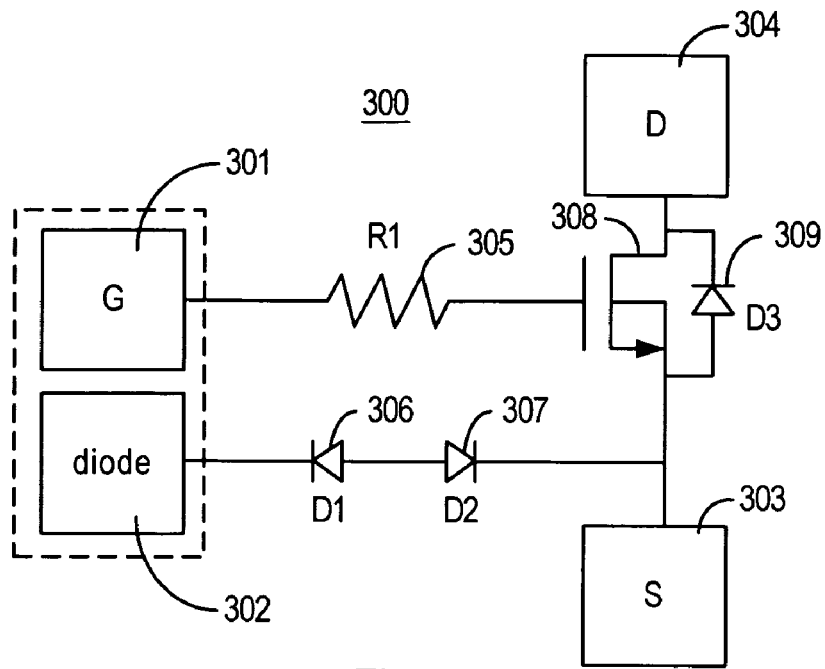
FIGS. 5A and 5B are circuit diagrams respectively during testing and after final assembly of a power MOSFET having separate gate and diode pads in accordance with an embodiment of the invention.

FIG. 5A shows a circuit diagram for a semiconductor die 300 containing ESD protection circuitry with a diode pad 302. Die 300 also includes an MOSFET 308 having a gate pad 301, a source pad 303, and a drain contact 304. MOSFET 308 can be a power MOSFET that includes multiple transistor cells having horizontal or vertical channels such as illustrated in FIG. 1C or 1D. An optional resistor 305 is between gate pad 301 and the gate of MOSFET 308, and a PN diode 309 is between source pad 303 and drain pad 304.

Diode pad 302 is connected to back-to-back Zener diodes 306 and 307, which are between diode pad 302 and source pad 303. In die 300, diode pad 302 is separated and electrically isolated from pads 301, 303, and 304 of MOSFET 308 except for the connection through diodes 306 and 307. Device 100 of FIG. 1A differs from die 300 in that diodes 104 and 105 are connected between gate pad 101 and source pad 102 in device 100, unlike diodes 305 and 306 that are not connected to gate pad 301 in die 300.

The separation of gate pad 301 and diode pad 302 allows testing of MOSFET 308 without interference from the ESD protection circuitry. In particular, a tester connected to gate pad 301 can control the voltage applied to the gate of MOSFET 308 and raise the gate voltage to near or above the breakdown voltage of diodes 306 and 307 in the ESD protection circuitry. Further, a conventional tester connected to diode pad 302 and source pad 303 can test the operation of diodes 306 and 307.

Figure 5B:
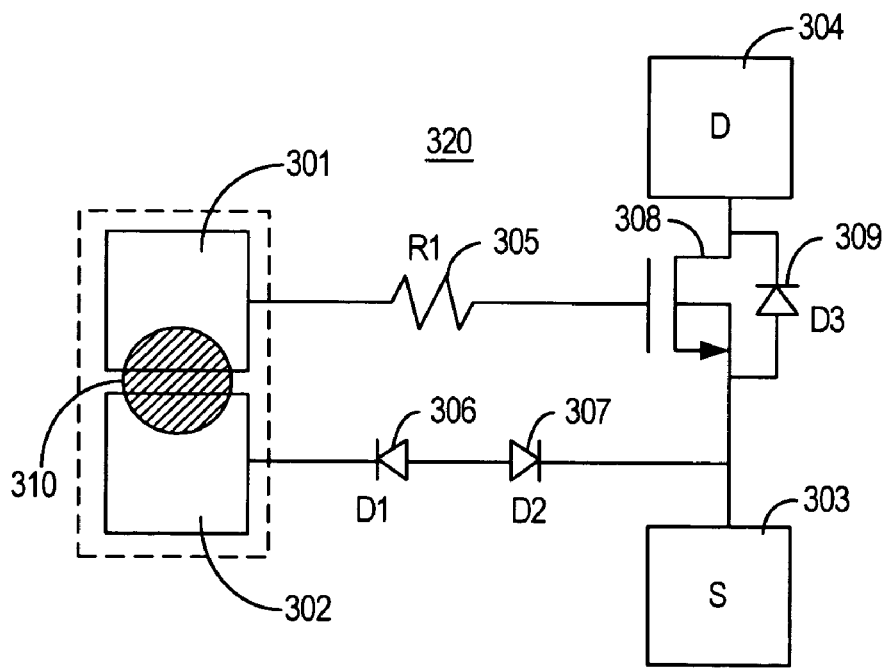

In one embodiment of die 300, diode pad 302 is adjacent gate pad 301 so that gate pad 301 and diode pad 302 reside in the same opening through an insulating layer or a passivation layer that covers power die 300. FIG. 5B represents a package 320 after assembly, where a bond ball 310 of the gate bonding wire makes electrical contact to gate pad 301 and likewise shorts gate pad 301 to diode pad 302, thereby completing the parallel connection of the ESD diodes and the gate oxide.

Figure 6A:
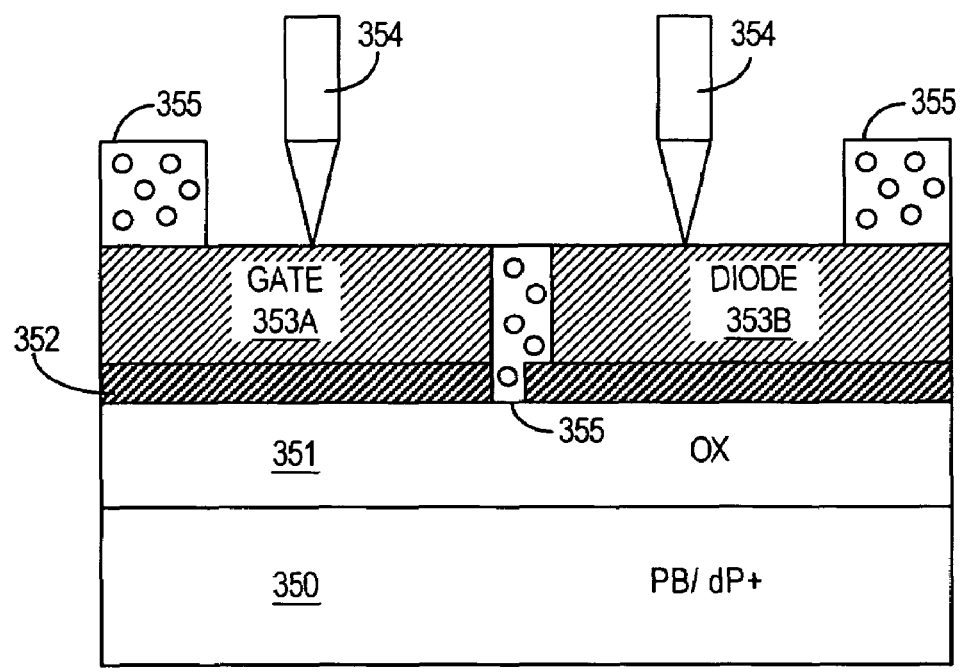
FIGS. 6A and 6B illustrate cross sectional views of bonding pads in a power MOSFET during testing and after wire bonding, respectively.

FIG. 6A shows a cross-sectional view of a portion of die 300 including gate pad 301 and diode pad 302 comprising metal pads 353A and 353B respectively. The bonding pads (typically Al, Al—Si, or Al—Cu—Si) overlie an insulating layer 351 (typically, $SiO_2$ or a glass) and may include a barrier or adhesive layer 352 that improves adhesion between insulating layer 351 and bonding metal pads 353A and 353B. Bonding Metal pads 353A and 353B can be formed anywhere on die 300, and in FIG. 6A, bonding metal pads 353A and 353B overlie a portion of P− type body or deep P+ region 350. Electrical connection of gate pad 301 to the gate of the MOSFET and electrical connection of diode pad 302 to diode 306 and 307 are made in a portion of die 300 not illustrated in FIG. 6A.

An opening in an insulating passivation layer 355 made of spin-on-glass (SOG), phosphosilicate glass (PSG), borophosphosilicate glass (BPSG), or silicon nitride ($Si_3N_4$) has an opening that permits probes 354 from a test system to contact bonding pads 353A and 353B for testing. In FIG. 6A, a portion of insulating layer 355 remains in a gap between bonding pads 353A and 353B, but alternatively, an etch process that forms the opening in insulating layer 355 may remove the material from the gap. In an exemplary embodiment of the invention, a single opening exposes portions of metal bonding pads 353A and 353B. Each bonding metal pad 353A or 353B has a size that depends on the size of the wire bond but will typically be no smaller than 50×50 μm and often may be 100×100 μm or larger. The gap between bonding pads 353A and 353B is can be about 10 μm or smaller. The passivation layer 355 is masked and removed across both metal pads 353A and 353B from the gap between metal pads 353A and 353B.

As illustrated in the schematic in FIG. 5B and the cross section of 6B, this configuration allows a conventional wire bonding process using wire bond 360 to form a bond ball connection 310 that contacts and electrically connects both bonding pads 301 and (i.e. 302, structurally as elements 353A and 353B). With wire bond 360 and ball bond 310, the device of FIG. 5B has ESD protection circuitry connected to protect the gate of MOSFET 308 from damage during an ESD strike.

Figure 7A:
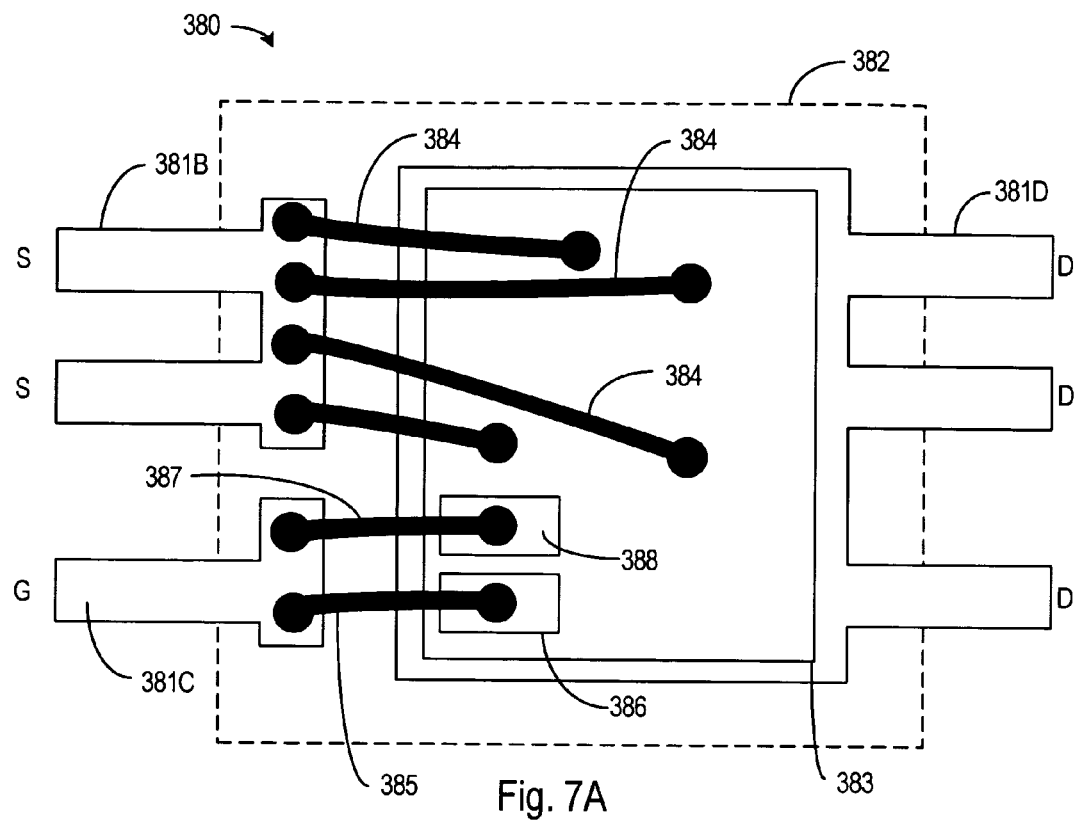
FIG. 7A is a plan view illustrating the wire bonds in a packaged power MOSFET in accordance with an embodiment of the invention.

FIG. 7A schematically shows a layout for a wire bonded package 380 for a die 383 containing a power MOSFET with ESD protection. An injection molded plastic 382 insulates and protects die 383 and hold leads and die in place, while lead frame portions 381A, 381B, and 381C provide external leads for electrical connections respectively to the drain, the source, and the gate of the power MOSFET in die 383.

In package 380, the drain pad or contact, which is on the back of die 383, is attached to lead frame portion 381A (drain leads), comprising electrical connections as well as a path for heat conduction. A conductive adhesive can electrically connect the drain pad (the backside of the die) of the power MOSFET to lead frame portion 381A. Leads extending from lead frame portion 381A thus provide electrical connections to the drain of the power MOSFET.

Lead frame portion 381B (source leads) is wire bonded using conventional techniques to source pads (not shown) on the surface of die 383. Leads extending from lead frame portion 381B thus provide an electrical connection to the source of the power MOSFET via wires 384. Alternatively, a metal clip could be used to connect the lead frame to the MOSFET's source metal.

A wire 385 electrically connects lead frame portion 381C (gate lead) to a gate pad 386 on die 383. Another wire 387 connects lead frame portion 381C to a diode pad 388 on die 383. Lead frame portion 381C being connected to both gate pad 386 and diode pad 388 provides the electrical connection required between the power MOSFET and the ESD protection circuitry and also provides external leads for electrical connection to the gate of the power MOSFET.

Figure 7B:
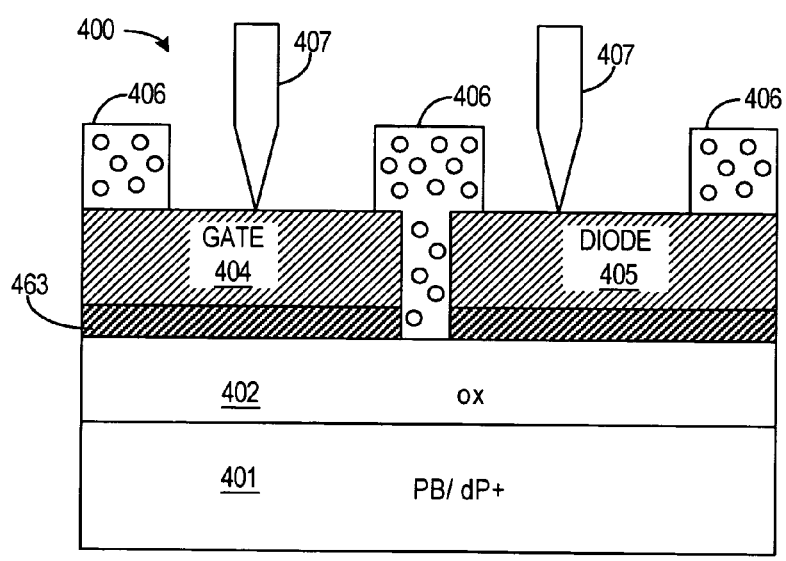
FIG. 7B is a cross-sectional view of a semiconductor structure including the gate and diode pads of a power MOSFET in accordance with an embodiment of the invention.

FIG. 7B is a cross-section of structure 400 in a die 383 before wire bonding to bonding pads 404 and 405 to a lead frame as in FIG. 7A. As an example bonding pad structure, bonding pads 404 and 405 have an adhesion layer 463 that strengthens the adhesion of bonding pads 404 and 405 to an underlying insulating layer 402. This adhesion layer may also act as a barrier metal between the thick metallization layer (typically Aluminum-Copper-Silicon) and the silicon mesa regions (the source body contact) in the power MOSFET. Typically, barrier materials are titanium nitride (TiN) formed as a standard part of the contact mask sequence in integrated circuit and power MOSFET manufacture. Bonding pads 404 and 405 can be anywhere on the die 383 but in FIG. 7B overlie a P-body region 401.

Separate openings in an insulating or passivation layer 406 expose portions of gate pad 404 and diode pad 405. The openings have sizes that are generally selected according to the requirements of the packaging process and can be separated by any desired distance. FIG. 7B shows separate probes 407 that through the openings in layer 406 contact bonding pads 404 and 405 for testing of the MOSFET and the ESD protection circuitry as described above.

Figure 7C:
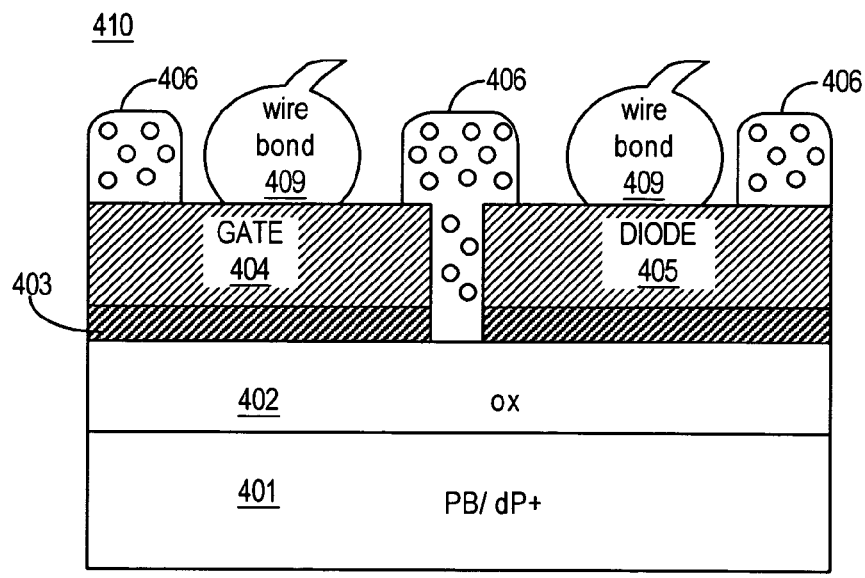
FIG. 7C illustrates the connection of separate bond wires to the gate and diode pads in the structure of FIG. 7B.

FIG. 7C illustrates the structure 410 after testing when separate wire bonds 9407 connect gate pad 404 and diode pad 405 to the lead frame.

Figure 8A:
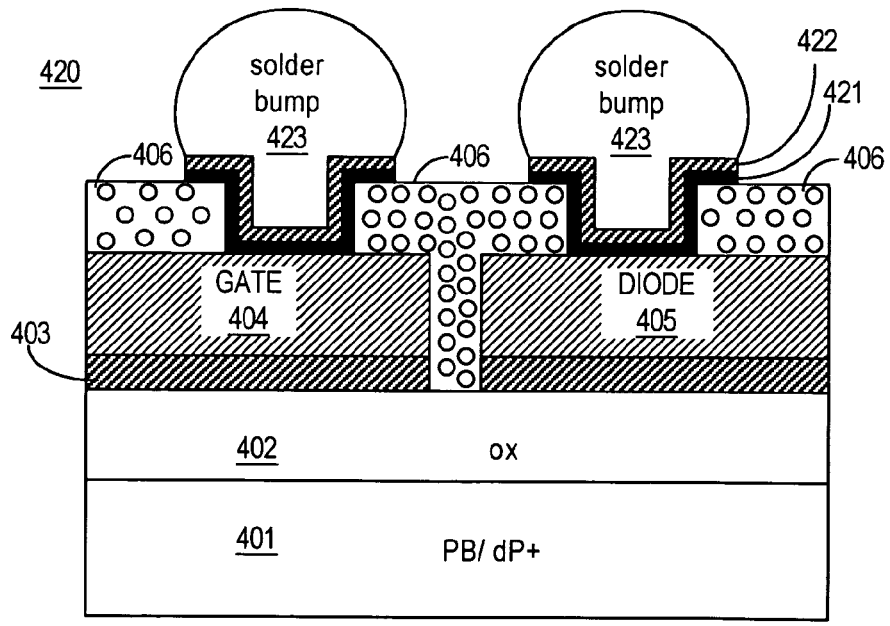
FIGS. 8A, 8B, and 8C are cross-sectional views of semiconductor structures encountered during the fabrication and testing of a power MOSFET in accordance with an embodiment of the invention having solder bumps on the gate and diode pads.

FIG. 8A illustrates an alternative structure for a diode pad 403 and a gate pad diode 404. Bonding pads 403 and 404 have external electrical connections through solder bumps 423. For the formation of solder bumps 423, a barrier layer 421 of a material such as tungsten (W) or titanium (Ti) and a pad layer 422 of a material such as titanium-nickel (Ti—Ni) are formed in and around the bond pad openings in insulating layer 406. Such layers can be formed using conventional techniques such as patterned deposition or plating. Solder bumps 423 of a material such as a silver-tin (Ag—Sn) solder or a lead-tin (Pb—Sn) solder are formed on pad layer 422 using conventional techniques.

Figure 8B:
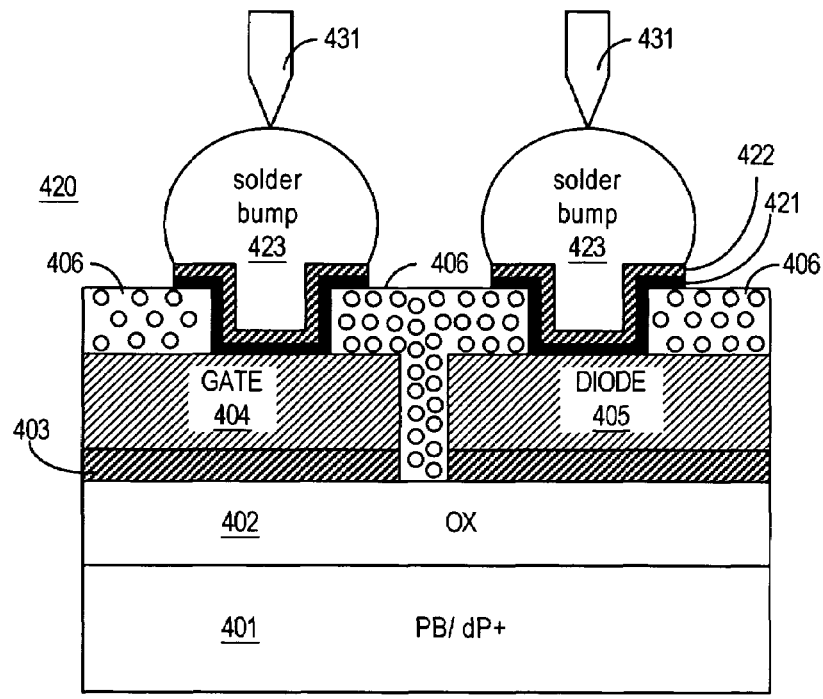

FIG. 8B illustrates that probes 431 can contact solder bumps 423 for separate testing of the power MOSFET and the ESD protection circuitry.

Figure 8C:
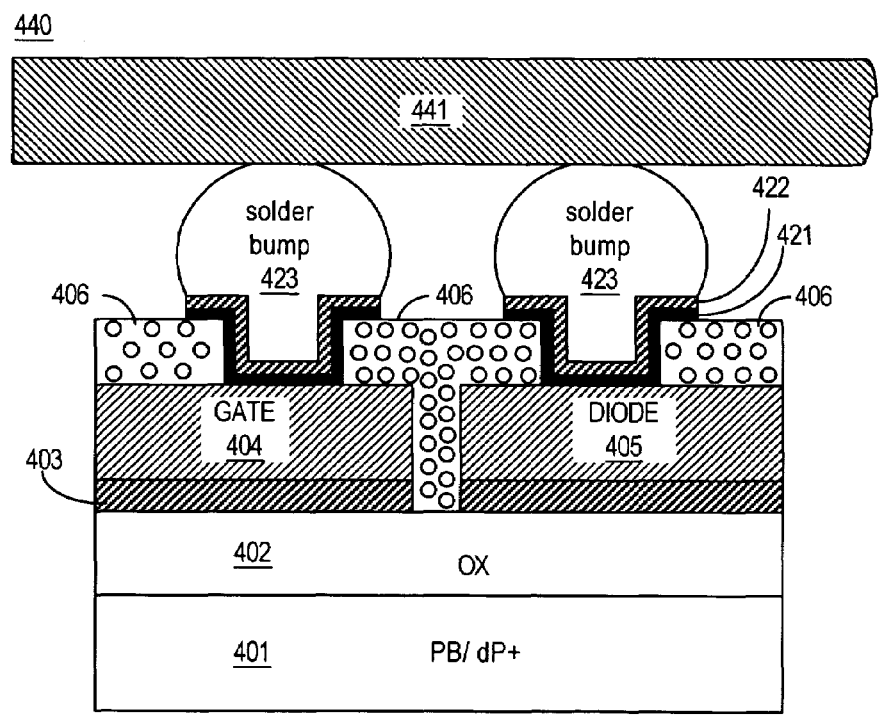

FIG. 8C shows a cross-section of a structure 440 after testing and after a flip-chip packaging process that attaches the die containing the power MOSFET to a substrate (not shown) such as a printed circuit board or a metal lead frame.

A solder reflow process attaches bumps 423 to a conductive region or trace pattern 441. In structure 440, the flip-chip packaging process attaches the solder bumps 423 on gate pad 404 and diode pad 405 to the same conductive region 441 of the substrate.

The above-described embodiments of the invention illustrate structures and processes for devices including one gate pad and one diode pad that are separate as illustrated in FIG. 5A for testing and electrically connected as illustrated in FIG. 5B for proper operation of the ESD protection circuitry. Many other configurations are possible.

Figure 9:
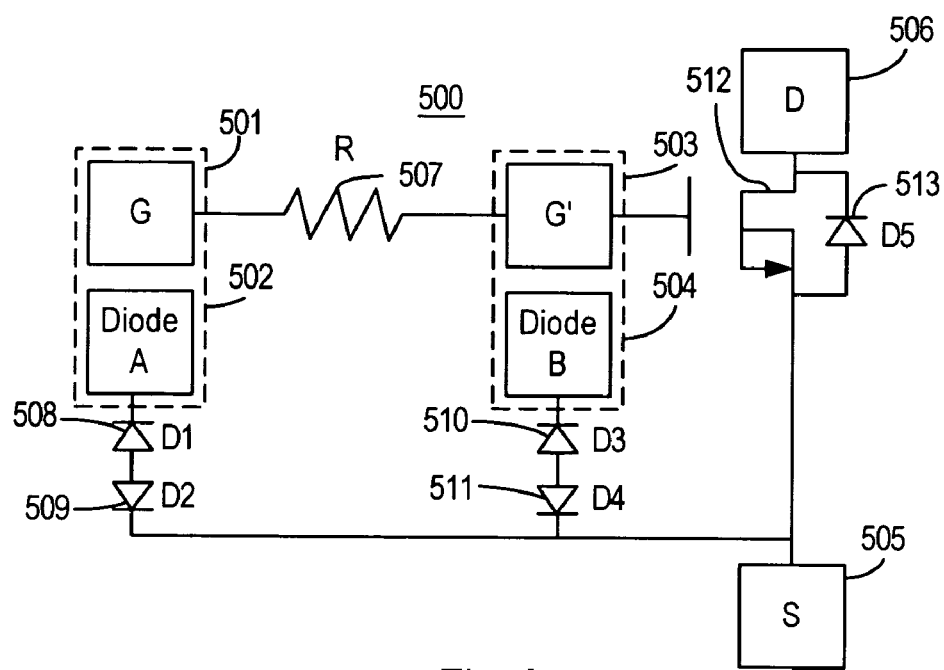
FIG. 9 is a circuit diagram of a power MOSFET in accordance with an embodiment of the invention having multiple gate pads and multiple diode pads for ESD protection circuitry including multiple pairs of back-to-back diodes.

FIG. 9 is a circuit diagram of a die 500 including a power MOSFET 512 and ESD protection circuitry. Die 500 includes a source pad 505 and a drain pad 506 connected to the source and drain of power MOSFET 512 and a zener diode 5313 connected between drain pad 506 and source pad 505. Power MOSFET 512 has two gate pads 501 and 503. Gate pad 503 is between the gate of power MOSFET 512 and a resistive element 507, and gate pad 501 connects to an end of resistive element 507 that is opposite to gate pad 503. Power MOSFET 512 can be tested through test probes contacting bonding pads 503, 505, and 506.

For ESD protection, die 500 also includes back-to-back diodes 508 and 509 that are connected between a first diode pad 502 and source pad 505. Back-to-back diodes 510 and 511 are similarly connected between a second diode pad 504 and source pad 505. With this configuration, diodes 508 and 509 can be tested through probes contacting diode pad 502 and source pad 505, and diodes 510 and 511 can be tested through probes contacting diode pad 504 and source pad 505.

Figure 1E:
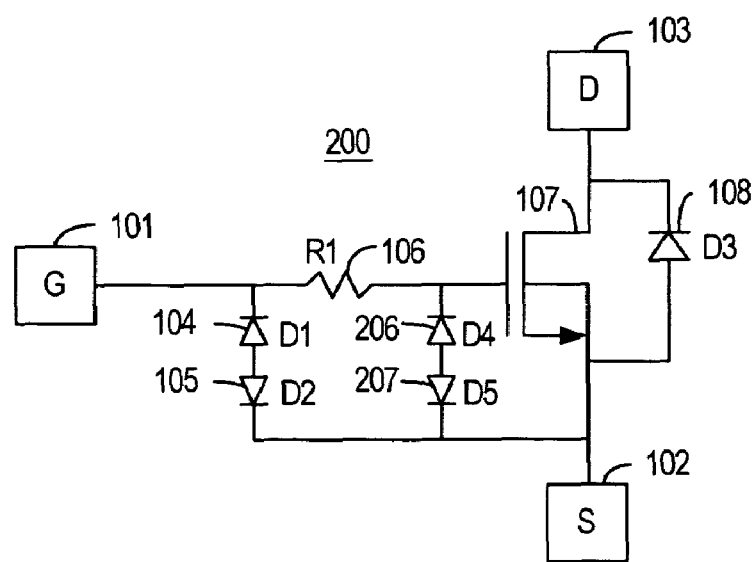
FIG. 1E is a circuit diagram of a power MOSFET with a known ESD protection circuit including multiple pairs of back-to-back diodes.
Figure 2A:
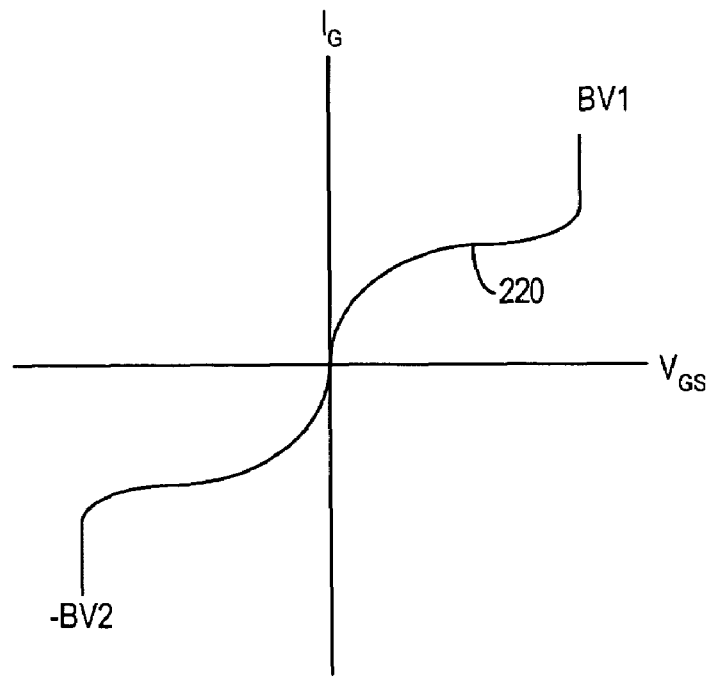
FIGS. 2A and 2B are respectively logarithmic and linear graphs illustrating the behavior of voltage and temperature dependence of ESD diode leakage, which is the principal component of current through the gate pad of the power MOSFET of FIG. 1A.
Figure 2B:
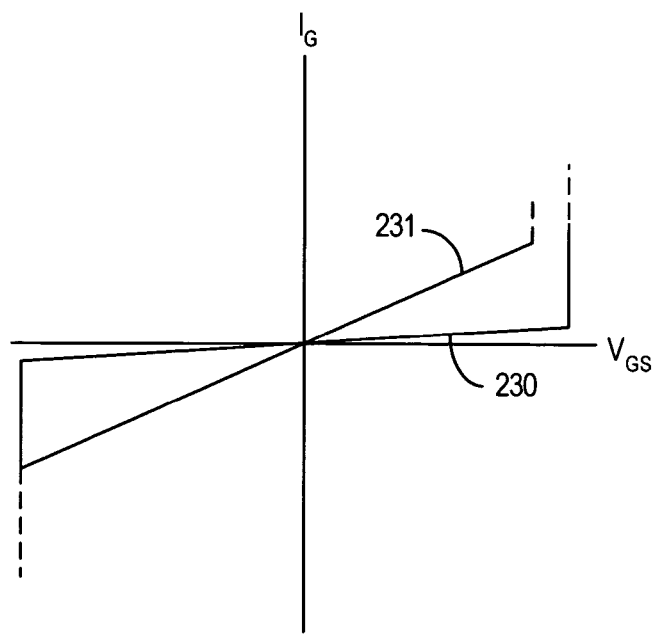
Figure 2C:
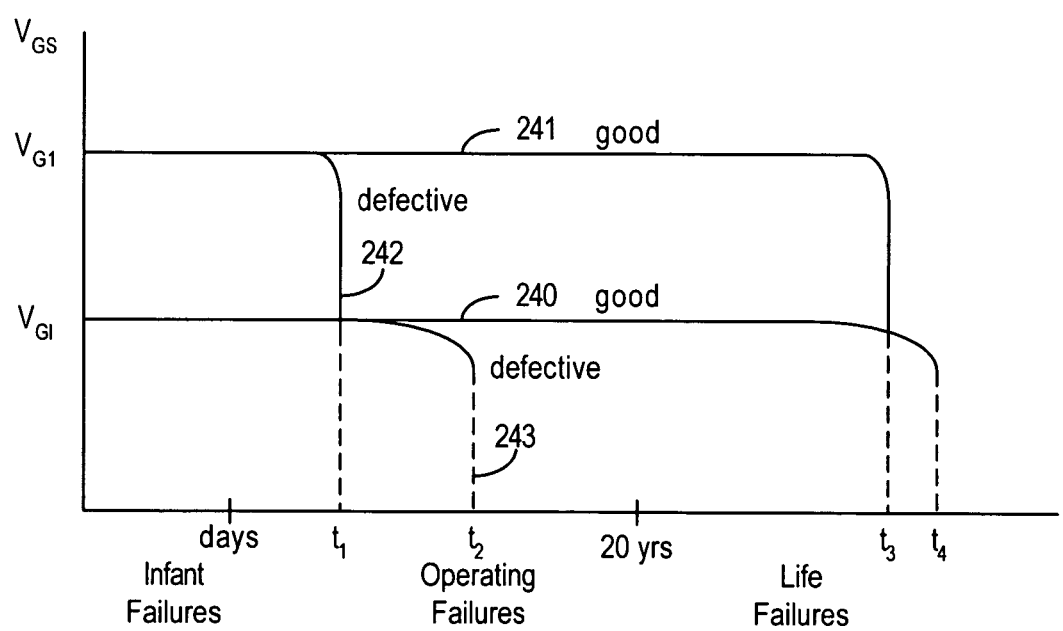
FIG. 2C contains plots illustrating the effect of the applied gate voltage level on the lifetime of good and defective power MOSFETs.
Figure 2D:
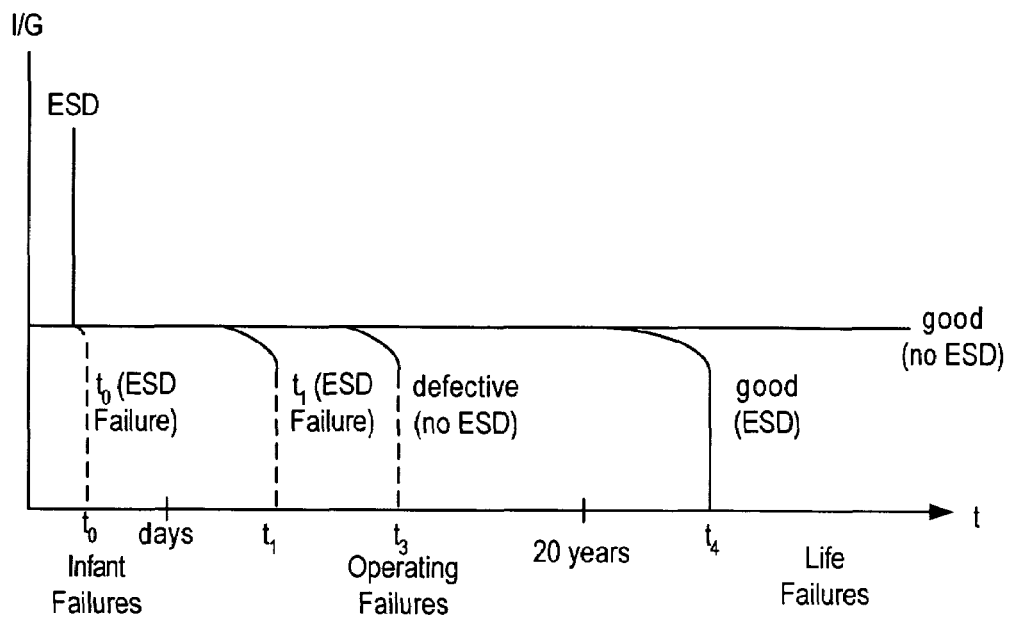
FIG. 2D contains plots illustrating the effect that an ESD has on power MOSFETs with and without adequate ESD protection.
Figure 2E:
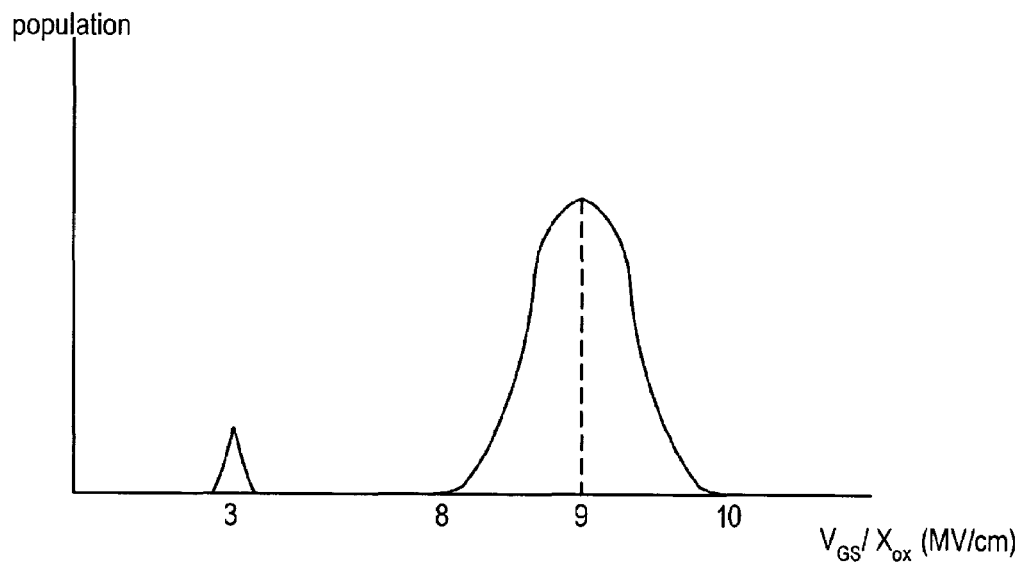
FIG. 2E is a population histogram for dielectric ruptures of silicon dioxide versus a range of electric field strength representative of the gate structures commonly employed in power MOSFETs.
Figure 3:
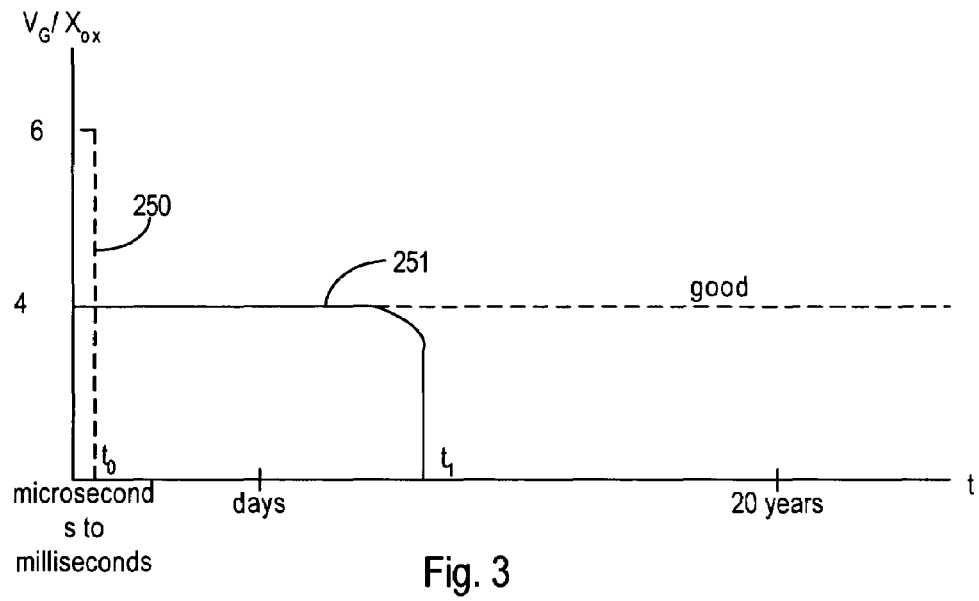
FIG. 3 contains a plot illustrating the effect of the applied gate voltage and electric field on the time required to detect a defective gate oxide in a power MOSFET.

After testing, the packaging process connects gate pad 501 to diode pad 502 and gate pad 503 to diode pad 504, so that the ESD protection operates in the same manner as ESD protection in device 200 of FIG. 1E. Generally, bonding pads 501 and 502 are connected to an external terminal of a package containing die 500.

Figure 6B:
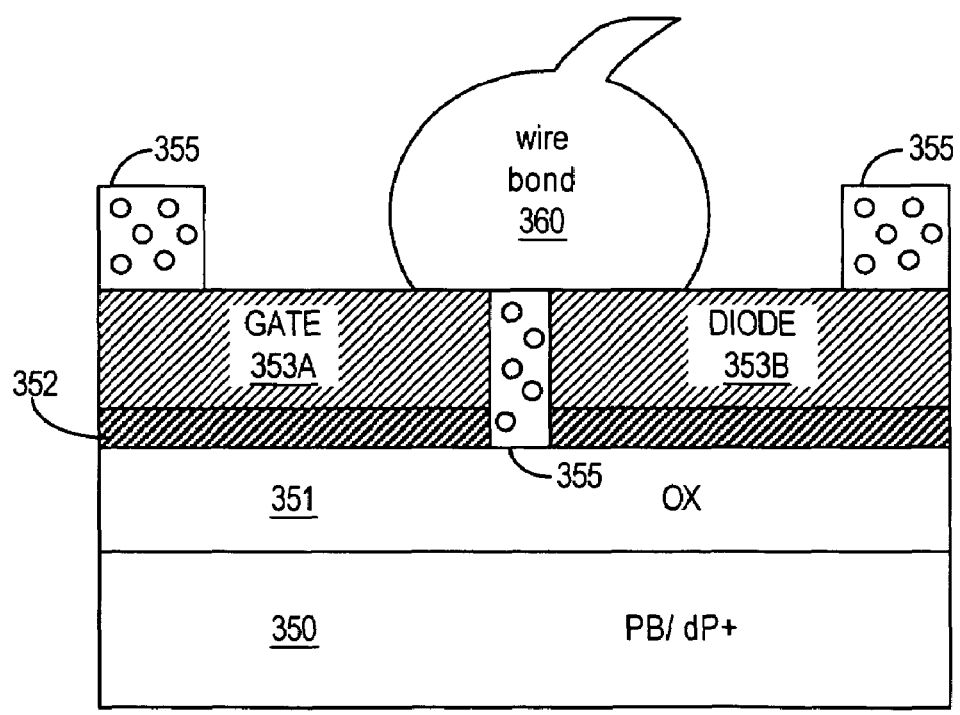

Bonding pads 503 and 504 do not require an external connection but can be connected using the above described techniques. For example, a single wire bond or solder bump that overlaps both bonding pads 503 and 504 (similar to the bond illustrated in FIG. 6B) can electrically connect bonding pads 503 and 504. For a single wire bond connected to both bonding pads 503 and 504, the wire from the wire bond can be omitted, cut, or attached to a portion of lead frame lacking an external terminal. Alternatively, a wire with one end bonded to gate pad 503 and the other end bonded to diode pad 504 can electrically connect the pads 503 and 504. In yet another alternative, separate solder bumps on bonding pads 503 and 504 can connect to the same conductive region of a substrate in a flip-chip package or on a printed circuit board, and the conductive region does not require a connection to an external terminal or circuit.

Figure 10:
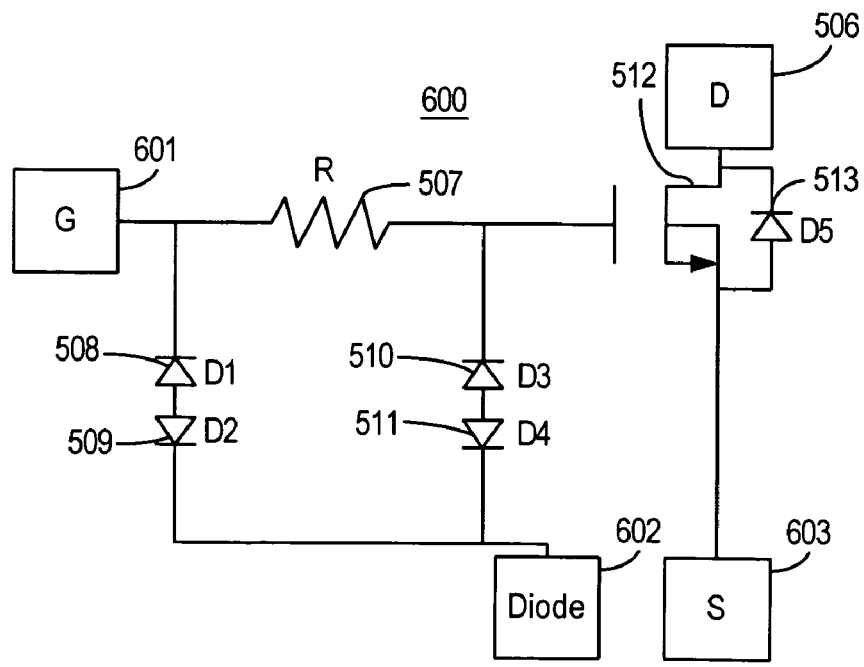
FIGS. 10 and 11 are circuit diagrams of power MOSFETs in accordance with embodiments of the invention having a single gate pad and a single diode pad for ESD protection circuitry including multiple pairs of back-to-back diodes.

FIG. 10 is a circuit diagram of a die 600 that has different bonding pads for the same ESD protection circuitry as in die 500 of FIG. 9. In particular, die 600 has a single gate pad 601 and a single diode pad 602, and diode 510 connects to the gate of power MOSFET 512 and resistive element 507. Further, diode 508 is connected to gate pad 601 instead of being connected to a diode pad, and diodes 509 and 511 connect to a diode pad 602.

With die 600, a test system contacting gate pad 601, a source pad 603, and drain pad 506 can test power MOSFET 512 without interference from the ESD protection circuitry. A test system contacting gate pad 601 and diode pad 602 can test the ESD protection circuitry, although the reduction in the number of bonding pads does not permit testing diodes 508 and 509 separately from testing diodes 510 and 511.

After testing, connecting diode pad 602 to source pad 603 enables operation of the ESD protection circuitry to protect power MOSFET 512. The diode pad 602 and gate source pad 603 can be connected using any of the techniques used to connect gate and diode pad contacts.

Figure 11:
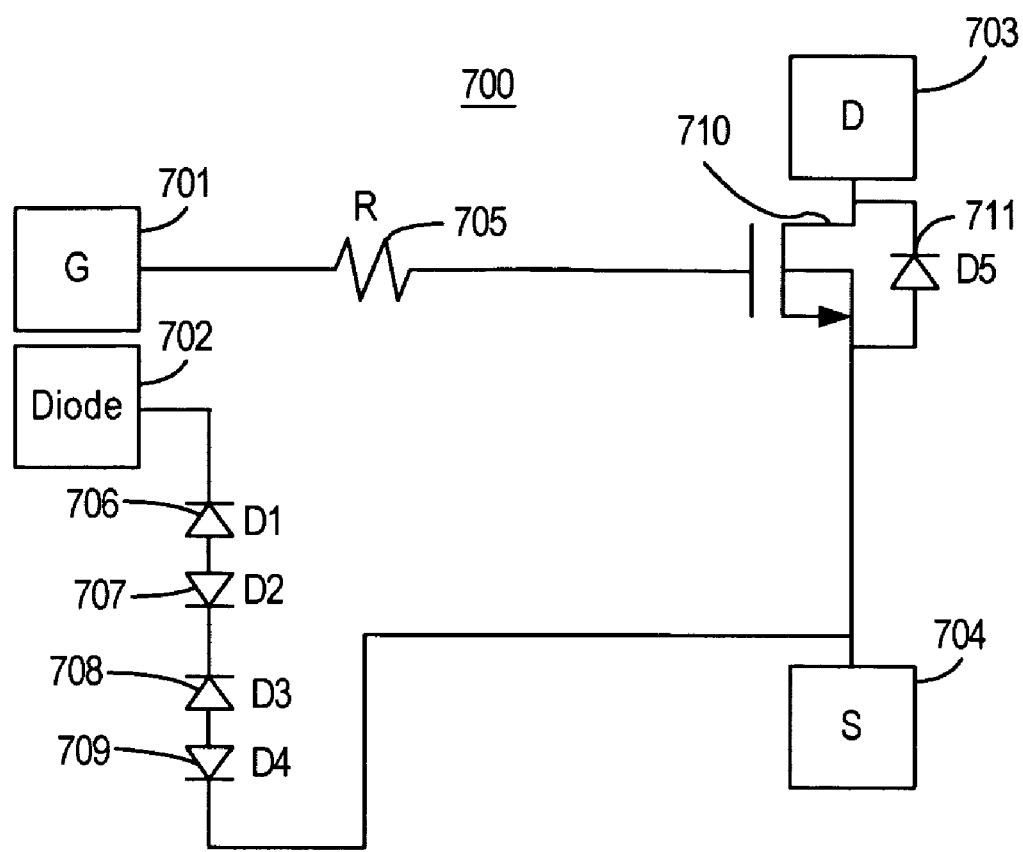

FIG. 11 is a circuit diagram of a die 700 including a power MOSFET 710 with ESD protection circuitry. Die 700 includes a gate pad 701 connected through a resistive element 705 to the gate of power MOSFET 710. A drain pad or contact 703 is connected to the drain of power MOSFET 710, and a source pad 704 is connected to the source of power MOSFET 710. A diode 711 that protects against breakdown in power MOSFET 710 is between drain pad 703 and source pad 704. For ESD protection, device die 700 includes four diodes 706, 707, 708, and 709 that are connected in series between diode pad 702 and source pad 704. Diodes 706 and 707 are connected back-to-back, as are diodes 708 and 709.

Other than the difference in the ESD protection circuitry, die 700 can be tested in the same manner as device 500 of FIG. 5A, using bonding pads 701, 703, and 704 for testing power MOSFET 710 and bonding pads 702 and 704 for testing the ESD protection circuitry. After testing, the packaging process connects gate pad 701 to diode pad 702 to make the ESD protection circuitry functional.

Although the invention has been described with reference to particular embodiments, the description is only an example of the invention's application and should not be taken as a limitation. For example, although the above embodiments employ specific types of ESD protection circuitry, principles of the invention can be used more generally with any type or design of ESD protection circuitry that can be separate from a device being protected. Various other adaptations and combinations of features of the embodiments disclosed are within the scope of the invention as defined by the following claims.

What is claimed is:

1. A method for manufacturing a semiconductor device, comprising:
    fabricating a die comprising a device having a first bonding pad and ESD protection circuitry having a second bonding pad;
    testing the device using a test system electrically connected to the first bonding pad; and
    after testing, connecting the first bonding pad to the second bonding pad, wherein the ESD protection circuitry becomes functional to protect the device against electrostatic discharge after connecting the first bonding pad to the second bonding pad.

2. The method of claim 1, wherein the device comprises a power MOSFET, and the die comprises a gate pad that is connected to a gate of the power MOSFET in the die.

3. The method of claim 2, wherein testing the device comprises applying to the gate of the power MOSFET a voltage that is higher than the ESD protection circuitry permits when the ESD protection circuitry is functional.

4. The method of claim 2, wherein the first bonding pad is the gate pad of the power MOSFET.

5. The method of claim 2, wherein the first bonding pad is a source pad that is connected to a source of the power MOSFET.

6. The method of claim 1, wherein before connecting the first bonding pad to the second bonding pad, the method further comprises testing the ESD protection circuitry using a test system that is electrically connected to the second bonding pad.

7. The method of claim 1, wherein testing is performed while the die is part of a wafer containing multiple dice.

8. The method of claim 7, wherein connecting the first bonding pad to the second bonding pad is performed after the die is separated from the wafer.

9. The method of claim 1, wherein connecting the first bonding pad to the second bonding pad is performed during packaging of the die.

10. The method of claim 1, wherein connecting the first bonding pad to the second bonding pad comprises forming a wire bond that contacts the first bonding pad and the second bonding pad.

11. The method of claim 1, wherein connecting the first bonding pad to the second bonding pad comprises:
 connecting a first wire to the first bonding pad and to a portion of a lead frame; and
 connecting a second wire to the second bonding pad and to the portion of the lead frame.

12. The method of claim 11, wherein the portion of the lead frame includes an external lead that provides an electrical connection to the first and second bonding pads in a package containing the die.

13. The method of claim 1, wherein connecting the first bonding pad to the second bonding pad comprises:
 forming a first conductive bump on the first bonding pad;
 forming a second conductive bump on the second bonding pad; and
 connecting the first conductive bump and the second conductive bump to a conductive region.

14. The method of claim 13, wherein connecting the first and second conductive bumps to a conductive region comprises:
 bringing a face of the die on which the first and second conductive bumps were formed into contact with a substrate including the conductive region; and
 performing a reflow process that attaches the conductive bumps to the conductive region.

15. A method for manufacturing a semiconductor device, comprising:
 fabricating a die comprising a device having a first bonding pad and ESD protection circuitry having a second bonding pad;
 testing the ESD protection circuitry using a test system electrically connected to the second bonding pad; and
 after testing, connecting the first bonding pad to the second bonding pad, wherein the ESD protection circuitry becomes functional to protect the device against electrostatic discharge after connecting the first bonding pad to the second bonding pad.

* * * * *